United States Patent
Wang et al.

(10) Patent No.: US 12,225,779 B2
(45) Date of Patent: Feb. 11, 2025

(54) DISPLAY SUBSTRATE, METHOD FOR FORMING THE SAME AND DISPLAY DEVICE EACH HAVING PART OF PIXEL DEFINITION LAYER ARRANGED IN GROOVE IN PLANARIZATION LAYER

(71) Applicant: BOE Technology Group Co., Ltd., Beijing (CN)

(72) Inventors: Linlin Wang, Beijing (CN); Ying Cui, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 429 days.

(21) Appl. No.: 17/765,397

(22) PCT Filed: Apr. 15, 2021

(86) PCT No.: PCT/CN2021/087439
§ 371 (c)(1),
(2) Date: Mar. 30, 2022

(87) PCT Pub. No.: WO2021/238482
PCT Pub. Date: Dec. 2, 2021

(65) Prior Publication Data
US 2022/0376007 A1 Nov. 24, 2022

(30) Foreign Application Priority Data
May 28, 2020 (CN) .......................... 202010465889.6

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC .......................... H10K 59/122; H10K 59/1201
See application file for complete search history.

(56) References Cited

U.S. PATENT DOCUMENTS

| | | | |
|---|---|---|---|
| 2007/0200488 A1 | 8/2007 | Ito | |
| 2010/0181554 A1* | 7/2010 | Yoshida | H10K 50/813 257/40 |

(Continued)

FOREIGN PATENT DOCUMENTS

| | | |
|---|---|---|
| CN | 101689559 A | 3/2010 |
| CN | 103545457 A | 1/2014 |

(Continued)

OTHER PUBLICATIONS

CN 202010465889.6 first office action.
PCT/CN2021/087439 international search report and written opinion.

*Primary Examiner* — Michael Jung
(74) *Attorney, Agent, or Firm* — IPro, PLLC

(57) ABSTRACT

A display substrate includes a base substrate, a thin film transistor array layer, a planarization layer, a first electrode and a pixel definition layer, the pixel definition layer defining a plurality of pixel openings, each pixel opening includes a first edge and a second edge adjacent to each other, the pixel definition layer includes a first pixel definition layer parallel to the first edge and a second pixel definition layer parallel to the second edge. A surface of the first pixel definition layer away from the base substrate is located at a level lower than a surface of the second pixel definition layer away from the base substrate, a groove parallel to the first edge is arranged in a surface of the planarization layer away from the base substrate, at least a part of the first pixel definition layer is arranged in the groove.

18 Claims, 5 Drawing Sheets

(56) References Cited

U.S. PATENT DOCUMENTS

| | | |
|---|---|---|
| 2010/0181559 A1 | 7/2010 | Nakatani et al. |
| 2015/0028292 A1 | 1/2015 | Kang |
| 2016/0035802 A1 | 2/2016 | Wang et al. |
| 2018/0097034 A1 | 4/2018 | Lee et al. |
| 2019/0165062 A1* | 5/2019 | Heo ............... H10K 50/813 |
| 2020/0091259 A1* | 3/2020 | Han ............... H10K 59/123 |
| 2020/0144350 A1 | 5/2020 | Han et al. |
| 2020/0295103 A1 | 9/2020 | Zou et al. |
| 2022/0173274 A1* | 6/2022 | Lee ............... H01L 25/0753 |

FOREIGN PATENT DOCUMENTS

| | | |
|---|---|---|
| CN | 107887417 A | 4/2018 |
| CN | 207199626 U | 4/2018 |
| CN | 109920825 A | 6/2019 |
| CN | 111146242 A | 5/2020 |
| CN | 111710694 A | 9/2020 |
| IN | 107731871 A | 2/2018 |

* cited by examiner

DISPLAY SUBSTRATE, METHOD FOR FORMING THE SAME AND DISPLAY DEVICE EACH HAVING PART OF PIXEL DEFINITION LAYER ARRANGED IN GROOVE IN PLANARIZATION LAYER

CROSS-REFERENCE TO RELATED APPLICATION

This application is the U.S. national phase of PCT Application No. PCT/CN2021/087439 filed on Apr. 15, 2021, which claims priority to Chinese Patent Application No. 202010465889.6 filed in China on May 28, 2020, which is incorporated by reference herein in its entirety.

TECHNICAL FIELD

The present disclosure relates to the field of display technology, in particular to a display substrate, a method for forming the display substrate and a display device.

BACKGROUND

An Organic Light-Emitting Diode (OLED) display device is one of the most promising next-generation display technologies due to such advantages as thin, light, wide viewing angle, self-luminescence, continuously adjustable light-emission color, low cost, fast response speed, low power consumption, low driving voltage, wide operation temperature range, simple manufacture process, high light-emission efficiency and flexible display.

An organic light-emitting layer of the OLED display substrate may be formed through such a film-forming method as evaporation and inkjet printing. Inkjet printing is considered as an important method to achieve large-scale and mass-production due to its high material utilization rate. However, a phenomenon of uneven image occurs due to the following during the inkjet printing. Firstly, it is unable to ensure that the amounts of ink from nozzles are exactly the same. As a result, a difference in light-emitting uniformity among pixels caused by a difference in the amounts of the ink may be recognized by human eyes after the display substrate has been energized. Secondly, due to a small pixel region and imperfect fluidity, it is difficult to form an organic light-emitting layer thin film having a uniform film thickness.

SUMMARY

An object of the present disclosure is to provide a display substrate, a method for forming the display substrate and a display device, so as to improve the uniformity of the thickness of a film formed through inkjet printing of the display substrate, thereby to improve the display effect of the display device and prolong a service life of the display substrate.

In order to achieve the above object, the embodiments of the present disclosure provide the following technical solutions.

A display substrate is provided, including a base substrate, a thin film transistor array layer located on the base substrate, a planarization layer covering the thin film transistor array layer, and a first electrode and a pixel definition layer located on the planarization layer, the pixel definition layer defining a plurality of pixel openings, each pixel opening includes a first edge and a second edge adjacent to each other, the pixel definition layer includes a first pixel definition layer parallel to the first edge and a second pixel definition layer parallel to the second edge in a display region of the display substrate. A surface of the first pixel definition layer away from the base substrate is located at a level lower than a surface of the second pixel definition layer away from the base substrate, a groove parallel to the first edge is arranged in a surface of the planarization layer away from the base substrate, at least a part of the first pixel definition layer is arranged in the groove, the pixel definition layer further includes a third pixel definition layer surrounding the display region, and a surface of the third pixel definition layer away from the base substrate is located at a level not lower than the surface of the second pixel definition layer away from the base substrate.

In some embodiments of the present disclosure, an orthogonal projection of the first pixel definition layer onto the base substrate is within an orthogonal projection of the groove onto the base substrate.

In some embodiments of the present disclosure, the first electrode includes a first sub-electrode portion located in the groove and a second sub-electrode portion located outside the groove, and the surface of the first pixel definition layer away from the base substrate is flush with a surface of the second sub-electrode portion away from the base substrate.

In some embodiments of the present disclosure, the first sub-electrode portion is coupled to an output electrode of the thin film transistor array layer through a via hole penetrating the planarization layer.

In some embodiments of the present disclosure, a groove bottom of the groove is located at a same level as a surface of an output electrode of the thin film transistor array layer away from the base substrate.

In some embodiments of the present disclosure, the display substrate includes a plurality of first electrodes separate from each other, and an orthogonal projection of a gap between adjacent first electrodes onto the base substrate is within an orthogonal projection of a groove bottom of the groove onto the base substrate.

In some embodiments of the present disclosure, the first electrode has a thickness of 100 nm to 130 nm.

In some embodiments of the present disclosure, a width of the groove in a direction perpendicular to the first edge and parallel to the base substrate ranges from 14 μm to 16 μm.

In some embodiments of the present disclosure, an orthogonal projection of the second pixel definition layer onto the base substrate does not overlap an orthogonal projection of the first electrode onto the base substrate.

In some embodiments of the present disclosure, a surface of the second pixel definition layer close to the base substrate is flush with a surface of the first electrode close to the base substrate.

In some embodiments of the present disclosure, the first pixel definition layer is made of a lyophilic material.

In some embodiments of the present disclosure, the second pixel definition layer includes a lyophilic material layer and a lyophobic material layer at a side of the lyophilic material layer away from the base substrate.

A display device is further provided, including the above-mentioned display substrate.

A method for forming a display substrate is further provided, including forming a thin film transistor array layer, a planarization layer covering the thin film transistor array layer, and a first electrode and a pixel definition layer on the planarization layer sequentially, where the pixel definition layer defines a plurality of pixel openings, the pixel definition layer defines a plurality of pixel openings, each pixel opening includes a first edge and a second edge adjacent to each other, the pixel definition layer includes a first pixel definition layer parallel to the first edge and a second pixel definition layer parallel to the second edge in a display region of the display substrate, a surface of the first pixel definition layer away from the base substrate is located at a level lower than a surface of the second pixel definition layer away from the base substrate, the pixel definition layer further includes a third pixel definition layer surrounding the display region, and a surface of the third pixel definition layer away from the base substrate is located at a level not lower than the surface of the second pixel definition layer away from the base substrate, and the method further includes: forming a groove parallel to the first edge in a surface of the planarization layer away from the base substrate; and forming at least a part of the first pixel definition layer in the groove.

In some embodiments of the present disclosure, the forming the first electrode includes: forming a first electrode material layer on the planarization layer in which the groove is formed; patterning the first electrode material layer to form a plurality of first electrodes separate from each other, where an orthogonal projection of a gap between adjacent first electrodes onto the base substrate is within an orthogonal projection of a groove bottom of the groove onto the base substrate.

In some embodiments of the present disclosure, the forming the first pixel definition layer includes: forming the first pixel definition layer in the groove through inkjet printing.

In some embodiments of the present disclosure, each first electrode includes a first sub-electrode portion located in the groove and a second sub-electrode portion located outside the groove, and the forming the first pixel definition layer in the groove through inkjet printing includes: forming the first pixel definition layer having a surface flush with a surface of the second sub-electrode portion away from the base substrate.

In some embodiments of the present disclosure, the forming the first pixel definition layer includes: forming the first pixel definition layer by using a lyophilic material.

In some embodiments of the present disclosure, the forming the second pixel definition layer includes: forming a lyophilic material layer; and forming a lyophobic material layer at a side of the lyophilic material layer away from the base substrate, where the lyophilic material layer and the lyophobic material layer form the second pixel definition layer.

The embodiments of the present disclosure have the following beneficial effects.

In the above-mentioned solution, the pixel definition layer includes the first pixel definition layer parallel to the first edge and the second pixel definition layer parallel to the second edge, the surface of the first pixel definition layer away from the base substrate is located at a level lower than the surface of the second pixel definition layer away from the base substrate, the first pixel definition layer may be used to separate pixels in a same color, and the second pixel definition layer may be used to separate pixels in different colors. In this regard, after an organic light-emitting material has been formed through inkjet printing in a pixel region defined by the pixel definition layer, the organic light-emitting material in a same color may flow in a direction perpendicular to the first edge in adjacent pixel regions, so as to enable the organic light-emitting material to spread uniformly, thereby to form an organic light-emitting layer thin film having a uniform thickness, reduce a difference in light-emitting uniformity among pixels, improve the display effect of the display device, and prolong the service life of the display substrate. In addition, a groove parallel to the first edge is arranged in the surface of the planarization layer away from the base substrate, the first pixel definition layer having a smaller thickness is located in the groove, it is able for the groove to increase a contact area between the first pixel definition layer and the display substrate, so as to provide an anchoring force to the first pixel definition layer to some extent, thereby to prevent the first pixel definition layer from peeling off the display substrate, and ensure the yield of the display substrate.

REFERENCE SIGN LIST

Figure 1:
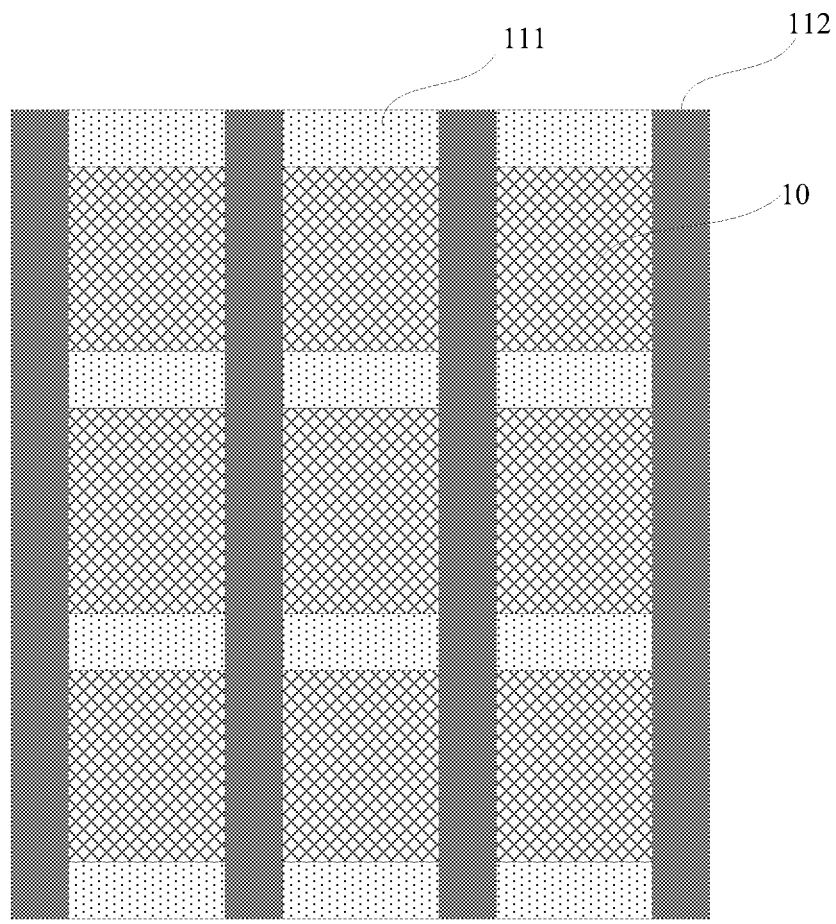
FIGS. 1 to 3 are each a schematic view of a display substrate.

1 Base substrate
2 Shielding metal layer
3 Buffer layer
4 Active layer
5 Gate insulating layer
6 Gate electrode
7 Interlayer insulating layer
81 Source electrode
82 Drain electrode
9 Planarization layer
10 First electrode
101 First sub-electrode portion
102 Second sub-electrode portion
111 First pixel definition layer
112 Second pixel definition layer
113 Third pixel definition layer
12 Organic light-emitting layer
121 First color organic light-emitting layer
122 Second color organic light-emitting layer
123 Third color organic light-emitting layer
13 Groove

DETAILED DESCRIPTION

In order to make the technical problems to be solved, the technical solutions and the advantages of the embodiments of the present disclosure more apparent, a detailed description will be given below with reference to the accompanying drawings and specific embodiments.

A display substrate, a method for forming the display substrate and a display device are provided in the embodiments of the present disclosure, so as to improve the uniformity of the thickness of a film formed through inkjet printing of the display substrate, thereby to improve the display effect of the display device and prolong a service life of the display substrate.

In order to form an organic light-emitting layer thin film with a uniform film thickness, two pixel definition layers having different thicknesses may be formed on the display substrate, so as to form two pixel definition layers having different surface heights, where the surface height is a distance between a surface of the pixel definition layer away from the base substrate and a surface of the base substrate close to the pixel definition layer. In some embodiments of the present disclosure, the pixel definition layer includes a first pixel definition layer parallel to the first edge and a second pixel definition layer parallel to the second edge, a surface height of the first pixel definition layer is lower than a surface height of the second pixel definition layer, the first pixel definition layer may be used to separate pixels in a same color, and the second pixel definition layer may be used to separate pixels in different colors. In this regard, after an organic light-emitting material has been formed through inkjet printing in a pixel region defined by the pixel definition layer, the organic light-emitting material in a same color may flow in a direction perpendicular to the first edge in adjacent pixel regions, so as to enable the organic light-emitting material to spread uniformly, thereby to form an organic light-emitting layer thin film having an uniform thickness, reduce a difference in light-emitting uniformity among pixels, improve the display effect of the display device, and prolong the service life of the display substrate.

In a manufacturing process of the display substrate, a first electrode is formed before forming a pixel definition layer. Generally, the first electrode is made of ITO, and a thickness of the first electrode is relatively small, generally about 10 nm. In a case that the pixel definition layer is formed through dry etching, the first electrode may be damaged, and the yield of the display substrate may be affected adversely. As a result, the pixel definition layer may be made of an organic photosensitive material through exposure and development processes. However, due to a relatively small thickness of the first pixel definition layer, the first pixel definition layer easily peels off the display substrate during development, thereby adversely affecting the yield of the display substrate.

Figure 2:
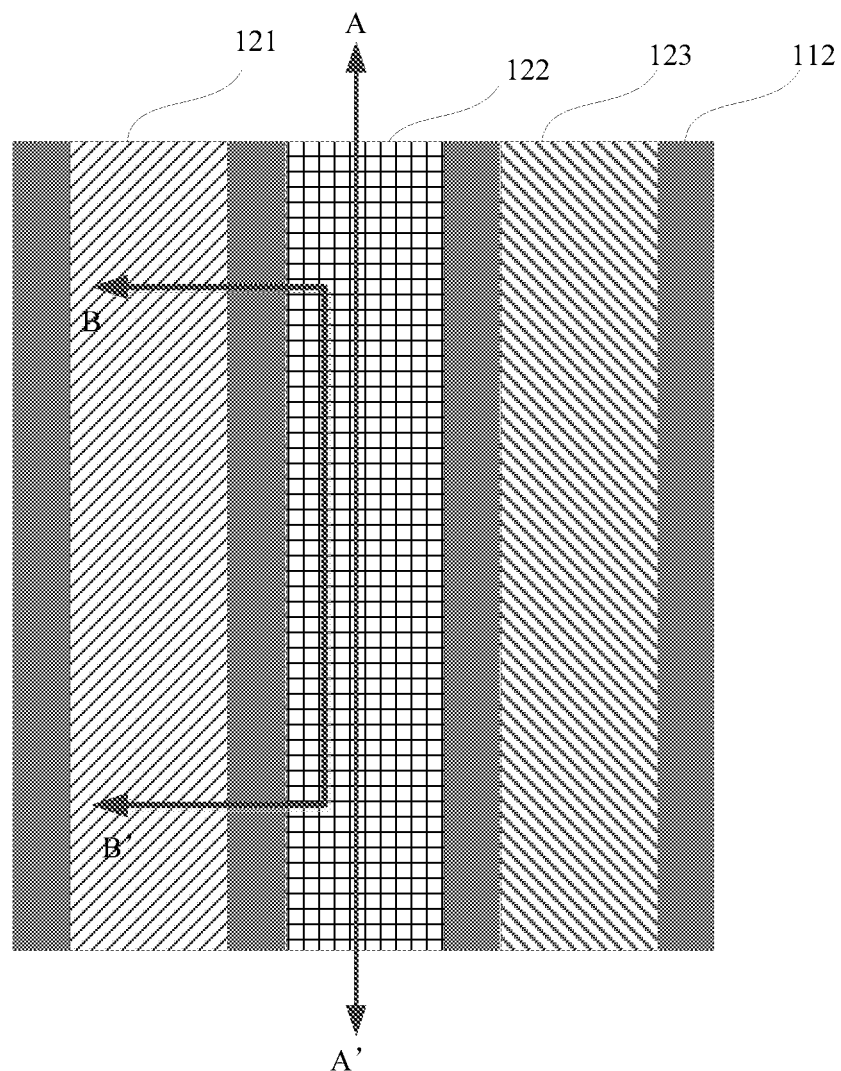
Figure 3:
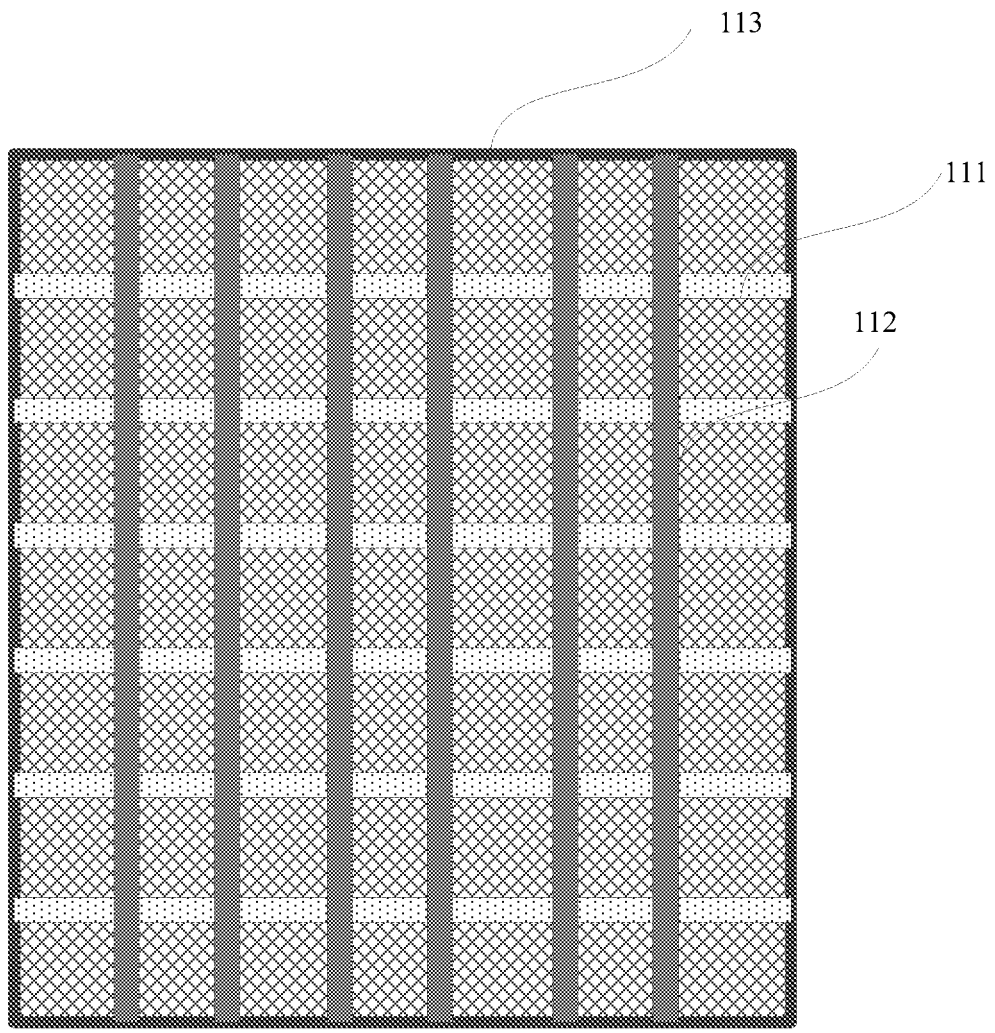
Figure 4:
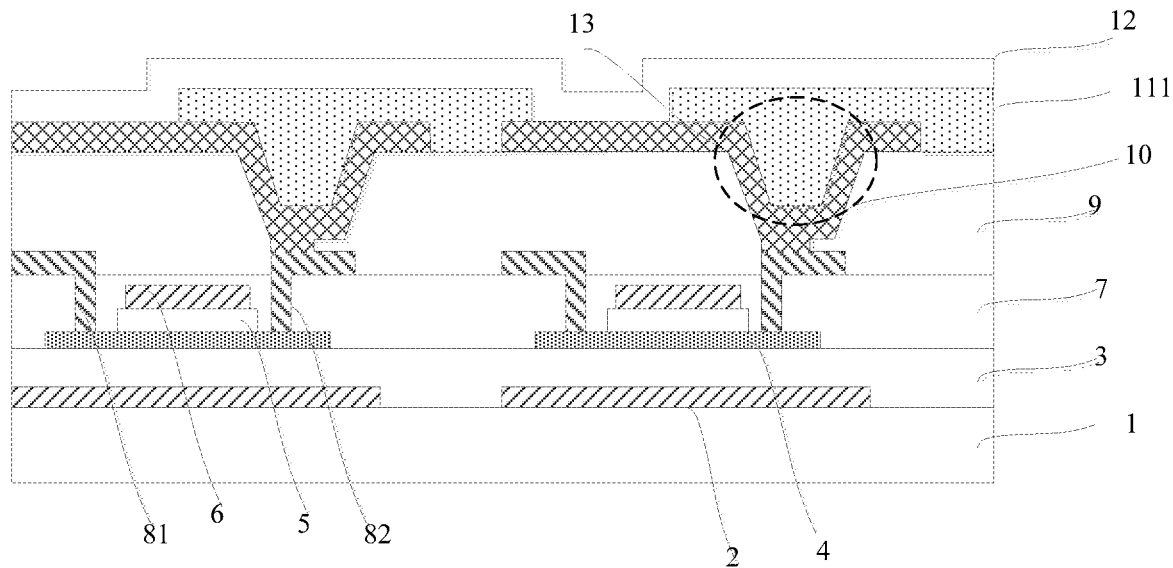
FIG. 4 is a sectional view of the display substrate in FIG. 2 along line AA' according to an embodiment of the present disclosure.

A display substrate is provided, as shown in FIGS. 1 to 4, where FIGS. 1 and 3 each shows the display substrate where before an organic light-emitting layer is formed, FIG. 2 shows the display substrate where after the organic light-emitting layer is formed, and FIG. 4 is a sectional view of the display substrate in FIG. 2 along line AA'. The organic light-emitting layer 12 includes a first color organic light-emitting layer 121, a second color organic light-emitting layer 122 and a third color organic light-emitting layer 123. The display substrate includes a base substrate 1, a thin film transistor array layer located on the base substrate 1, a planarization layer 9 covering the thin film transistor array layer, and a first electrode 10 and a pixel definition layer located on the planarization layer 9, the pixel definition layer defines a plurality of pixel openings, each pixel opening includes a first edge and a second edge adjacent to each other, the pixel definition layer includes a first pixel definition layer 111 parallel to the first edge and a second pixel definition layer 112 parallel to the second edge in a display region of the display substrate. A surface of the first pixel definition layer 111 away from the base substrate is located at a level lower than a surface of the second pixel definition layer 112 away from the base substrate, a groove 13 parallel to the first edge is arranged in a surface of the planarization layer 9 away from the base substrate, at least a part of the first pixel definition layer 111 is arranged in the groove 13.

Further, as shown in FIG. 3, the pixel definition layer further includes a third pixel definition layer surrounding the display region, and a surface of the third pixel definition layer away from the base substrate is located at a level not lower than the surface of the second pixel definition layer away from the base substrate. It is able for the third pixel definition layer 113 to block the organic light-emitting material from flowing out of the display region when the organic light-emitting material is formed through inkjet printing.

In the embodiment of the present disclosure, the pixel opening may be of a rectangular shape, the pixel opening includes the first edge and the second edge adjacent to each other, the first edge is perpendicular to the second edge, the pixel definition layer includes the first pixel definition layer parallel to the first edge and the second pixel definition layer parallel to the second edge, the surface height of the first pixel definition layer is lower than the surface height of the second pixel definition layer, the first pixel definition layer may be used to separate the pixels in the same color, and the second pixel definition layer may be used to separate the pixels in different colors. In this regard, after the organic light-emitting material has been formed through inkjet printing in the pixel region defined by the pixel definition layer, the organic light-emitting material in the same color may flow in the direction perpendicular to the first edge in adjacent pixel regions, so as to enable the organic light-emitting material to spread uniformly, thereby to form the organic light-emitting layer thin film having the uniform thickness, reduce the difference in light-emitting uniformity among pixels, improve the display effect of the display device, and prolong the service life of the display substrate. In addition, a groove parallel to the first edge is arranged in the surface of the planarization layer away from the base substrate, the first pixel definition layer having a smaller thickness is located in the groove, it is able for the groove to increase a contact area between the first pixel definition layer and the display substrate, so as to provide an anchoring force to the first pixel definition layer to some extent, thereby to prevent the first pixel definition layer from peeling off the display substrate, and ensure the yield of the display substrate.

As can be appreciated by a person skilled in the art that the display substrate further includes an organic light-emitting layer located at a side of the pixel definition layer away from the base substrate and a second electrode located at a side of the organic light-emitting layer away from the base substrate. Based on this, the first electrode may be an anode and the second electrode may be a cathode, or, the first electrode may be a cathode and the second electrode may be an anode.

The display substrate in the embodiments of the present disclosure may be of a top emission type, in which case the first electrode close to the base substrate is non-transparent and the second electrode away from the base substrate is transparent. The display substrate may also be of a bottom emission type, in which case the first electrode close to the base substrate is transparent and the second electrode away from the base substrate is non-transparent. The display substrate may also be of a two-sided emission type, in which case both the first electrode close to the base substrate and the second electrode away from the base substrate are transparent.

In the case where the first electrode or the second electrode is transparent, the first electrode or the second electrode may be made of such material as Indium Tin Oxide (ITO), Indium Zinc Oxide (IZO) or Indium Gallium Zinc Oxide (IGZO). In the case where the first electrode or the second electrode is non-transparent, for example, the first electrode or the second electrode may include an Indium Tin Oxide (ITO) layer, an Ag layer and an ITO layer laminated one on another sequentially.

The base substrate 1 may be a flexible substrate or a rigid substrate, and the rigid substrate may be a glass substrate or a quartz substrate.

In the embodiment of the present disclosure, an extension direction of the first edge may be a row direction of the display substrate, and an extension direction of the second edge may be a column direction of the display substrate. Alternatively, the extension direction of the first edge may be the column direction of the display substrate and the extension direction of the second edge may be the row direction of the display substrate.

Taking a case where the extension direction of the first edge is the row direction of the display substrate and the extension direction of the second edge is the column direction of the display substrate as an example, in each column of pixels of the display substrate, N adjacent pixels have a same color, where N is an integer greater than 2, and N may be equal to the quantity of rows of pixels in the display substrate. In the case that N is equal to the quantity of the rows of the pixels in the display substrate, pixel definition layers of which extension directions are each the row direction are the first pixel definition layers. In the case that N is less than the quantity of the rows of the pixels in the display substrate, apart from the first pixel definition layers, the pixel definition layers of which extension directions are each the row direction may further include a fourth pixel definition layer having a surface height different from the surface height of the first pixel definition layers, where the surface height of the fourth pixel definition layer needs to be greater than the surface height of the first pixel definition layers so as to separate pixels in different colors, and the surface height of the fourth pixel definition layer may be equal to the surface height of the second pixel definition layer.

Figure 5:
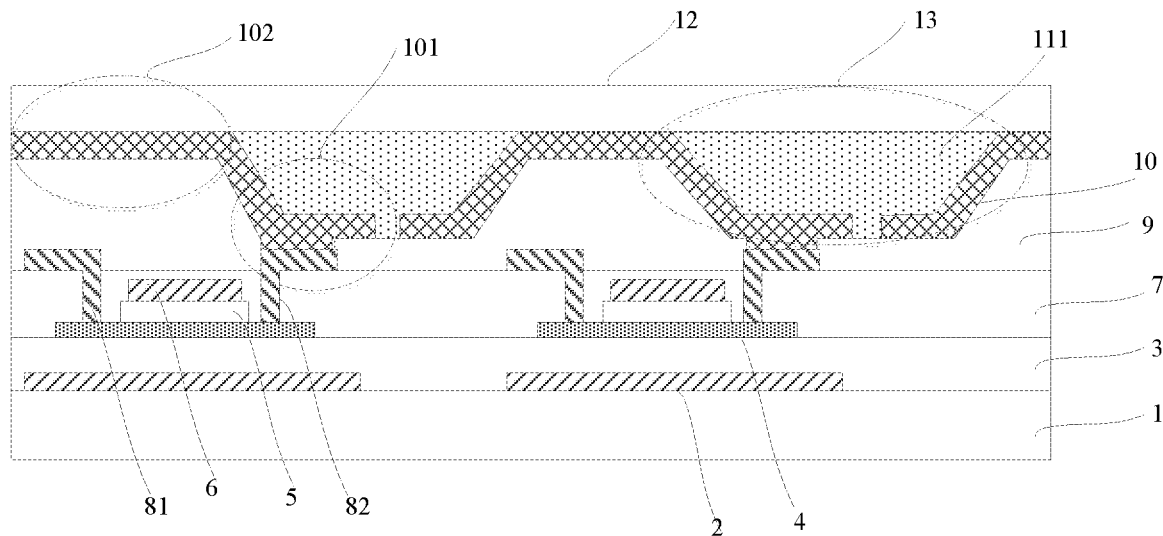
FIG. 5 is another sectional view of the display substrate in FIG. 2 along line AA' according to an embodiment of the present disclosure.

As shown in FIG. 4, the first pixel definition layer 111 may be partially located in the groove 13. In some embodiments, as shown in FIG. 5, an orthogonal projection of the first pixel definition layer 111 onto the base substrate 1 is within an orthogonal projection of the groove 13 onto the base substrate 1. In this way, it is able to provide the anchoring force from the groove to the first pixel definition layer to the greatest extent, thereby to prevent the first pixel definition layer 111 from peeling off the display substrate.

In the embodiment of the present disclosure, since the groove 13 needs to accommodate the first pixel definition layer 111, a size of the groove 13 may be increased in an appropriate manner, and a width of the groove 13 in a direction perpendicular to the first edge and parallel to the base substrate 1 may range from 14 µm to 16 µm.

In some embodiments of the present disclosure, as shown in FIG. 5, the first electrode 10 includes a first sub-electrode portion 101 located in the groove 13 and a second sub-electrode portion 102 located outside the groove 13, and the surface of the first pixel definition layer 111 away from the base substrate 1 is flush with a surface of the second sub-electrode portion 102 away from the base substrate 1. In this way, the first pixel definition layer 111 is fully located in the groove 13, so as to reduce a probability that the first pixel definition layer 111 peels off from the display substrate to the greatest extent. In addition, the surface of the first pixel definition layer 111 away from the base substrate 1 and the surface of the second sub-electrode portion 102 away from the base substrate 1 form a planarization surface, so as to provide the planarization surface for the subsequent formation of the organic light-emitting layer. Thus, after an organic light-emitting layer solution is printed in the pixel region, it is able for the organic light-emitting layer solution to sufficiently flow in the direction perpendicular to the first edge and spread uniformly in adjacent pixel regions, thereby to form the organic light-emitting layer thin film with a uniform film thickness, and reduce the difference in light-emitting uniformity among pixels.

In order to prevent the first electrode 10 from being damaged when forming the pixel definition layer, the thickness of the first electrode 10 may be increased in an appropriate manner. In the embodiment of the present disclosure, the thickness of the first electrode may be 100 nm to 130 nm, such as 120 nm.

As shown in FIGS. 4 and 5, the thin film transistor array layer includes an active layer 4, a gate insulating layer 5, a gate electrode 6, an interlayer insulating layer 7, a source electrode 81 and a drain electrode 82 which are located on the base substrate 1. The first electrode 10 may be coupled to the drain electrode 82 (i.e., an output electrode of the thin film transistor array layer) through a via hole penetrating the planarization layer 9, and it may be a case where the first sub-electrode portion 101 is coupled to the drain electrode 82, or a case where the second sub-electrode portion 102 is coupled to the drain electrode 82. Since a thickness of the planarization layer between the second sub-electrode portion 102 and the drain electrode 82 is relatively large, and a thickness of the planarization layer between the first sub-electrode portion 101 and the drain electrode 82 is relatively small, it may be the case where the first sub-electrode portion 101 is coupled to the output electrode, i.e., the drain electrode 82, of the thin film transistor array layer through the via hole penetrating the planarization layer 9. As a consequence, it is able to reduce a depth of the via hole and ensure the reliability of the connection between the first electrode 10 and the drain electrode 82.

In some embodiments of the present disclosure, a groove bottom of the groove 13 is located at a same level as a surface of the drain electrode 82 away from the base substrate 1, that is, the groove 13 penetrates the entire planarization layer, and it is equivalent that a height of the via hole is 0. In this way, the first sub-electrode portion 101 may be in direct contact with the drain electrode 82 at the groove bottom of the groove, so as to form a surface contact between the first sub-electrode portion 101 and the drain electrode 82, thereby to ensure the reliability of the connection between the first sub-electrode portion 101 and the drain electrode 82.

In the embodiment of the present disclosure, the display substrate includes a plurality of first electrodes 10 separate from each other, and the first electrodes 10 correspond to pixels respectively. As shown in FIG. 4, an orthogonal projection of a gap between adjacent first electrodes 10 onto the base substrate 1 may be located outside an orthogonal projection of the groove 13 onto the base substrate 1. As shown in FIG. 5, in order to ensure the flatness of a surface formed by the surface of the second sub-electrode portion away from the base substrate 1 and the surface of the first pixel definition layer 111 away from the base substrate 1, the orthogonal projection of the gap between adjacent first electrodes 10 onto the base substrate 1 is located within the orthogonal projection of the groove bottom of the groove 13 onto the base substrate 1. In this way, after the pixel definition layer has been formed, except for a region where the second pixel definition layer 112 is located, other regions of the pixel definition layer are flat, so as to provide the planarization surface for the subsequent formation of the organic light-emitting layer. Thus, after an organic light-emitting layer solution is printed in the pixel region, it is able for the organic light-emitting layer solution to sufficiently flow in the direction perpendicular to the first edge and spread uniformly in adjacent pixel regions, thereby to form the organic light-emitting layer thin film with a uniform film thickness, and reduce the difference in light-emitting uniformity among pixels.

In order to prevent the first electrode 10 from being damaged when forming the pixel definition layer through a patterning process, the pixel definition layer may be formed through inkjet printing.

Figure 6:
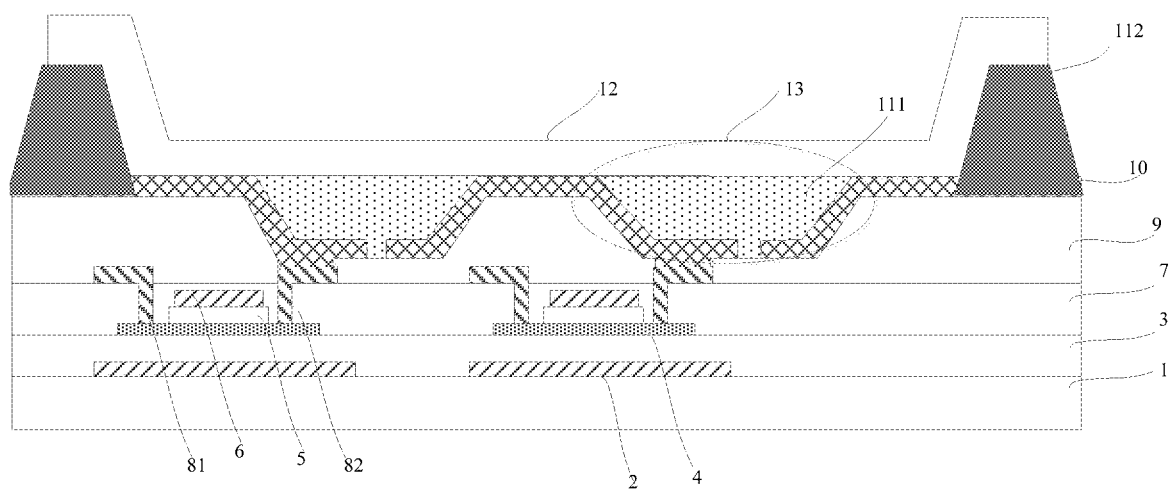
FIG. 6 is a sectional view of the display substrate in FIG. 2 along line BB' according to an embodiment of the present disclosure.

FIG. 6 is a sectional view of the display substrate in FIG. 2 along line BB'. As shown in FIG. 6, the second pixel definition layer 112 may be formed on the planarization surface, the surface of the second pixel definition layer 112 close to the base substrate 1 may be flush with the surface of the first electrode 10 close to the base substrate 1, and no groove is provided in a region of the planarization layer corresponding to the second pixel definition layer 112, so as to enable a surface height of the second pixel definition layer 112 to be relatively large, thereby to separate the pixels in different colors from each other. As shown in FIG. 6, an orthogonal projection of a surface of the second pixel definition layer 112 away from the base substrate onto the base substrate is located within an orthogonal projection of a surface of the second pixel definition layer 112 close to the base substrate onto the base substrate, namely, a side surface of the second pixel definition layer 112 is a slope surface, so it is able to avoid the occurrence of breakage between the organic light-emitting layer 12 and the second electrode that are subsequently formed.

The second pixel definition layer 112 may also be formed in a groove. For example, the groove is further provided in the region of the planarization layer corresponding to the second pixel definition layer 112, and a part or all of the orthogonal projection of the second pixel definition layer 112 onto the base substrate is located within an orthogonal projection of the groove onto the base substrate, so it is able for the groove to increase a contact area between the second pixel definition layer and the display substrate, thereby to provide an anchoring force to the second pixel definition layer 112 to some extent, prevent the second pixel definition layer 112 from peeling off from the display substrate, and ensure the yield of the display substrate.

When the organic light-emitting layer solution is formed in the pixel region through inkjet printing, the organic light-emitting layer solution may cover the first pixel definition layer 111 and does not cover the second pixel definition layer 112.

As shown in FIG. 6, the orthogonal projection of the second pixel definition layer 112 onto the base substrate 1 does not overlap with the orthogonal projection of the first electrode 10 onto the base substrate. Thus, it is able to ensure the first electrodes 10 of adjacent pixels to be separate from each other.

In some embodiments of the present disclosure, the first pixel definition layer 111 is made of a lyophilic material, and the second pixel definition layer 112 includes a lyophilic material layer and a lyophobic material layer at a side of the lyophilic material layer away from the base substrate 1. When the first pixel definition layer 111 is made of a lyophilic material, and the second pixel definition layer 112 is a combination of a lyophilic material layer and a lyophobic material layer, where the lyophilic material layer is closer to the base substrate 1, it is able to effectively avoid the occurrence of a severe climbing phenomenon at a periphery of a pixel during the formation of the organic light-emitting layer solution in the pixel region through inkjet printing, thereby to improve the film thickness uniformity of the organic light-emitting layer.

When the organic light-emitting layer is formed through an inkjet printing process, in the case that one nozzle is used to provide ink to one pixel region so as to form the organic light-emitting layer in the pixel region, due to a difference in the amount of the ink among a plurality of nozzles, the organic light-emitting layer formed in pixel regions may have a non-uniform thickness, and thus light from the pixel regions has non-uniform brightness.

In the display substrate of the embodiments of the present disclosure, taking the case where the extending direction of the first edge is the row direction of the display substrate and the extending direction of the second edge is the column direction of the display substrate as an example, in each column of pixels of the display substrate, N adjacent pixels are in the same color, and spaced apart from each other by the first pixel definition layers. Since the surface height of the first pixel definition layer is relatively small, the N adjacent pixel regions are connected to each other, when ink is printed in the pixel regions through inkjet printing, the ink may flow among the N adjacent pixel regions, it is able to reduce the difference in the amounts of the ink among different pixel regions, thereby to ensure that the thickness of the organic light-emitting layer formed in each of the N adjacent pixel regions is uniform.

A display device is further provided, including the above-mentioned display substrate. The display device includes, but not limited to: a radio frequency unit, a network module, an audio output unit, an input unit, a sensor, a display unit, a user input unit, an interface unit, a memory, a processor, and a power supply, etc. As can be appreciated by those skilled in the art that the structure of the above-mentioned display device is not construed as limiting the display device, and the display device may include more or fewer of the components described above, or a combination of the components, or different arrangements of the components. In the embodiments of the present disclosure, the display device includes, but not limited to, a display, a mobile phone, a flat-panel computer, a television, a wearable electronic device, a navigation display device, and the like.

The display device may be any product or member having a display function, e.g., a television, a display, a digital photo frame, a mobile phone or a flat-panel computer. The display device may further include a flexible circuit board, a printed circuit board and a back plate.

A method for forming a display substrate is further provided in the embodiments of the present disclosure, including forming a thin film transistor array layer, a planarization layer covering the thin film transistor array layer, and a first electrode and a pixel definition layer on the planarization layer sequentially, where the pixel definition layer defines a plurality of pixel openings, the pixel definition layer defines a plurality of pixel openings, each pixel opening includes a first edge and a second edge adjacent to each other, the pixel definition layer includes a first pixel definition layer parallel to the first edge and a second pixel definition layer parallel to the second edge in a display region of the display substrate, a surface of the first pixel definition layer away from the base substrate is located at a level lower than a surface of the second pixel definition layer away from the base substrate, the pixel definition layer further includes a third pixel definition layer surrounding the display region, and a surface of the third pixel definition layer away from the base substrate is located at a level not lower than the surface of the second pixel definition layer away from the base substrate, and the method further includes: forming a groove parallel to the first edge in a surface of the planarization layer away from the base substrate; and forming at least a part of the first pixel definition layer in the groove.

In the embodiment of the present disclosure, the pixel definition layer includes the first pixel definition layer parallel to the first edge and the second pixel definition layer parallel to the second edge, the surface height of the first pixel definition layer is lower than the surface height of the second pixel definition layer, the first pixel definition layer may be used to separate pixels in a same color, and the second pixel definition layer may be used to separate pixels in different colors. In this regard, after an organic light-emitting material has been formed through inkjet printing in a pixel region defined by the pixel definition layer, the organic light-emitting material in a same color may flow in a direction perpendicular to the first edge in adjacent pixel regions, so as to enable the organic light-emitting material to spread uniformly, thereby to form an organic light-emitting layer thin film having an uniform thickness, reduce a difference in light-emitting uniformity among pixels, improve the display effect of the display device, and prolong the service life of the display substrate. In addition, a groove parallel to the first edge is arranged in the surface of the planarization layer away from the base substrate, the first pixel definition layer having a smaller thickness is located in the groove, it is able for the groove to increase a contact area between the first pixel definition layer and the display substrate, so as to provide an anchoring force to the first pixel definition layer to some extent, thereby to prevent the first pixel definition layer from peeling off the display substrate, and ensure the yield of the display substrate.

In some embodiments of the present disclosure, the forming the first electrode includes: forming a first electrode material layer on the planarization layer in which the groove is formed; patterning the first electrode material layer to form a plurality of first electrodes separate from each other, where an orthogonal projection of a gap between adjacent first electrodes onto the base substrate is within an orthogonal projection of a groove bottom of the groove onto the base substrate.

In the embodiment of the present disclosure, the display substrate includes a plurality of first electrodes 10 separate from each other, and the first electrodes 10 correspond to pixels respectively. As shown in FIG. 4, an orthogonal projection of a gap between adjacent first electrodes 10 onto the base substrate 1 may be located outside an orthogonal projection of the groove 13 onto the base substrate 1. As shown in FIG. 5, in order to ensure the flatness of a surface formed by the surface of the second sub-electrode portion of the first electrode outside the groove 13 away from the base substrate 1 and the surface of the first pixel definition layer 111 away from the base substrate 1, the orthogonal projection of the gap between adjacent first electrodes 10 onto the base substrate 1 is located within the orthogonal projection of the groove bottom of the groove 13 onto the base substrate 1. In this way, after the pixel definition layer has been formed, except for a region where the second pixel definition layer 112 is located, other regions of the pixel definition layer are flat, so as to provide the planarization surface for the subsequent formation of the organic light-emitting layer. Thus, after an organic light-emitting layer solution is printed in the pixel region, it is able for the organic light-emitting layer solution to sufficiently flow in the direction perpendicular to the first edge and spread uniformly in adjacent pixel regions, thereby to form the organic light-emitting layer thin film with a uniform film thickness, and reduce the difference in light-emitting uniformity among pixels.

In some embodiments of the present disclosure, the forming the first pixel definition layer includes: forming the first pixel definition layer in the groove through inkjet printing. In order to prevent the first electrode 10 from being damaged when forming the pixel definition layer through a patterning process, the first pixel definition layer may be formed through inkjet printing. Thus, the first electrode 10 may not be damaged, thereby to ensure the yield of the display substrate.

In some embodiments of the present disclosure, the forming the second pixel definition layer includes: forming the second pixel definition layer through inkjet printing. In order to prevent the first electrode 10 from being damaged when forming the pixel definition layer through a patterning process, the second pixel definition layer may be formed through inkjet printing. Thus, the first electrode 10 may not be damaged, thereby to ensure the yield of the display substrate.

The second pixel definition layer 112 may be formed on the planarization surface, as shown in FIG. 6, the surface of the second pixel definition layer 112 close to the base substrate 1 may be flush with the surface of the first electrode 10 close to the base substrate 1, and no groove is provided in a region of the planarization layer corresponding to the second pixel definition layer 112, so as to enable a surface height of the second pixel definition layer 112 to be relatively large, thereby to separate the pixels in different colors from each other. As shown in FIG. 6, an orthogonal projection of a surface of the second pixel definition layer 112 away from the base substrate onto the base substrate is located within an orthogonal projection of a surface of the second pixel definition layer 112 close to the base substrate onto the base substrate, namely, a side surface of the second pixel definition layer 112 is a slope surface, so it is able to avoid the occurrence of breakage between the organic light-emitting layer 12 and the second electrode that are subsequently formed.

The second pixel definition layer 112 may also be formed in a groove. For example, the groove is further provided in the region of the planarization layer corresponding to the second pixel definition layer 112, and a part or all of the orthogonal projection of the second pixel definition layer 112 onto the base substrate is located within an orthogonal projection of the groove onto the base substrate, so it is able for the groove to increase a contact area between the second pixel definition layer and the display substrate, thereby to provide an anchoring force to the second pixel definition layer 112 to some extent, prevent the second pixel definition layer 112 from peeling off from the display substrate, and ensure the yield of the display substrate.

In some embodiments of the present disclosure, each first electrode includes a first sub-electrode portion located in the groove and a second sub-electrode portion located outside the groove, and the forming the first pixel definition layer in the groove through inkjet printing includes: forming the first pixel definition layer having a surface flush with a surface of the second sub-electrode portion away from the base substrate.

As shown in FIG. 5, the first electrode 10 includes a first sub-electrode portion 101 located in the groove 13 and a second sub-electrode portion 102 located outside the groove 13, and the surface of the first pixel definition layer 111 away from the base substrate 1 is flush with a surface of the second sub-electrode portion 102 away from the base substrate 1. In this way, the first pixel definition layer 111 is fully located in the groove 13, so as to reduce a probability that the first pixel definition layer 111 peels off from the display substrate to the greatest extent. In addition, the surface of the first pixel definition layer 111 away from the base substrate 1 and the surface of the second sub-electrode portion 102 away from the base substrate 1 form a planarization surface, so as to provide the planarization surface for the subsequent formation of the organic light-emitting layer. Thus, after an organic light-emitting layer solution is printed in the pixel region, it is able for the organic light-emitting layer solution to sufficiently flow in the direction perpendicular to the first edge and spread uniformly in adjacent pixel regions, thereby to form the organic light-emitting layer thin film with a uniform film thickness, and reduce the difference in light-emitting uniformity among pixels.

When the organic light-emitting layer solution is formed in the pixel region through inkjet printing, the organic light-emitting layer solution may cover the first pixel definition layer 111 and does not cover the second pixel definition layer 112.

In some embodiments of the present disclosure, the forming the first pixel definition layer includes: forming the first pixel definition layer by using a lyophilic material.

In some embodiments of the present disclosure, the forming the second pixel definition layer includes: forming a lyophilic material layer; and forming a lyophobic material layer at a side of the lyophilic material layer away from the base substrate, where the lyophilic material layer and the lyophobic material layer form the second pixel definition layer.

In the embodiment of the present disclosure, when the first pixel definition layer 111 is made of a lyophilic material, and the second pixel definition layer 112 is a combination of a lyophilic material layer and a lyophobic material layer, where the lyophilic material layer is closer to the base substrate 1, it is able to effectively avoid the occurrence of a severe climbing phenomenon at a periphery of a pixel during the formation of the organic light-emitting layer solution in the pixel region through inkjet printing, thereby to improve the film thickness uniformity of the organic light-emitting layer.

In a specific embodiment of the present disclosure, the method for forming the display substrate includes the following steps.

Step 1, as shown in FIG. 5, a light-shielding metal layer 2, a buffer layer 3, the active layer 4, the gate insulating layer 5, the gate electrode 6, the interlayer insulating layer 7, the source electrode 81, the drain electrode 82 and the planarization layer 9 are formed sequentially on the base substrate 1.

The base substrate 1 may be a glass substrate or a quartz substrate, and may also be a flexible base substrate.

To be specific, the light-shielding metal layer 2 having a thickness of about 500 Å to 4000 Å may be deposited on the base substrate 1 through sputtering or thermal evaporation, the light-shielding metal layer 2 may be made of a metal such as Cu, Al, Ag, Mo, Cr, Nd, Ni, Mn, Ti, Ta, W, or an alloy thereof, and the light-shielding metal layer 2 may be of a single-layered structure, or a multi-layered structure such as Cu/Mo, Ti/Cu/Ti or Mo/Al/Mo. A photoresist is applied onto the light-shielding metal layer, and then exposed using a mask to form a photoresist reserved region corresponding to a region where the light-shielding metal layer is located and a photoresist unreserved region corresponding to a region other than the light-shielding metal layer. Next, a developing process may be performed, so as to fully remove the photoresist at the photoresist unreserved region, and maintain a thickness of the photoresist at the photoresist reserved region. Finally, the light-shielding metal layer at the photoresist unreserved region may be fully etched off through an etching process, and the remaining photoresist may be removed, so as to form a pattern of the light-shielding metal layer 2.

Next, the buffer layer 3 with a thickness of 500 Å to 5000 Å may be deposited on the base substrate 1 through Plasma Enhanced Chemical Vapor Deposition (PECVD), and the buffer layer 3 may be made of an oxide, a nitride or an oxynitride.

Next, a semiconductor material layer may be deposited on the buffer layer 3 to form the active layer 4.

Next, the gate insulating layer 5 having a thickness of 500 Å to 5000 Å may be deposited on the base substrate 1 through PECVD, and the gate insulating layer 5 may be made of an oxide, a nitride or an oxynitride.

Next, a gate metal layer having a thickness of about 500 Å to 4000 Å may be deposited on the gate insulating layer 5 through sputtering or thermal evaporation, and the gate metal layer may be made of such a metal as Cu, Al, Ag, Mo, Cr, Nd, Ni, Mn, Ti, Ta, W, or an alloy thereof. The gate metal layer may be of a single-layered structure, or a multi-layered structure such as Cu/Mo, Ti/Cu/Ti or Mo/Al/Mo. A photoresist is applied onto the gate metal layer, and then exposed using a mask to form a photoresist reserved region corresponding to a region where the gate metal layer is located and a photoresist unreserved region corresponding to a region other than gate metal layer. Next, a developing process may be performed, so as to fully remove the photoresist at the photoresist unreserved region, and maintain a thickness of the photoresist at the photoresist reserved region. Finally, the gate metal layer at the photoresist unreserved region may be fully etched off through an etching process, and the remaining photoresist may be removed, so as to form a pattern of the gate metal layer including the gate electrode 6.

Next, the interlayer insulating layer 7 having a thickness of 500 Å to 5000 Å may be deposited on the base substrate 1 through PECVD, and the interlayer insulating layer 7 may be made of an oxide, a nitride or an oxynitride.

Next, a source/drain metal layer having a thickness of about 500 Å to 4000 Å may be deposited on the interlayer insulating layer 7 through sputtering or thermal evaporation, and the source/drain metal layer may be made of such a metal as Cu, Al, Ag, Mo, Cr, Nd, Ni, Mn, Ti, Ta, W, or an alloy thereof. The source/drain metal layer may be of a single-layered structure, or a multi-layered structure such as Cu/Mo, Ti/Cu/Ti or Mo/Al/Mo. A photoresist is applied onto the source/drain metal layer, and then exposed using a mask to form a photoresist reserved region corresponding to a region where the source/drain metal layer is located and a photoresist unreserved region corresponding to a region other than source/drain metal layer. Next, a developing process may be performed, so as to fully remove the photoresist at the photoresist unreserved region, and maintain a thickness of the photoresist at the photoresist reserved region. Finally, the source/drain metal layer at the photoresist unreserved region may be fully etched off through an etching process, and the remaining photoresist may be removed, so as to form a pattern of the source/drain metal layer including the source electrode 81 and the drain electrode 82 of a driving thin film transistor.

Next, an organic siloxane resin solution may be applied on the base substrate, the planarization layer 9 is cured and formed through a pre-baking process and a post-baking process, where the flatness of the planarization layer 9 may meet the requirements on flatness for inkjet printing. The planarization layer 9 is exposed and developed to form the groove 13, and the groove bottom of the groove 13 has a via hole exposing the drain electrode 82.

Step 2, as shown in FIG. 5, the first electrode 10 is formed.

To be specific, a first electrode material layer may be formed on the planarization layer 9, and a photoresist is applied onto the first electrode material layer, and then exposed and developed to form a photoresist reserved region and a photoresist unreserved region. Next, the first electrode material layer at the photoresist unreserved region may be etched off through an etching process, and the remaining photoresist may be removed, so as to form the first electrode 10. The first electrode material may be ITO, and may have a thickness of 120 nm. The first electrode 10 is coupled to the drain electrode 82 through a via hole penetrating the planarization layer 9.

Step 3, as shown in FIGS. 5 and 6, the pixel definition layer is formed.

To be specific, an organic insulating material may be formed through inkjet printing so as to form the pixel definition layer, and the pixel definition layer includes the first pixel definition layer 111 and the second pixel definition layer 112 located in the display region. In order to prevent the first pixel definition layer 111 from peeling off from the display substrate, through controlling the amount of the ink of the pixel definition layer, the dried first pixel definition layer 111 just fills up the groove 13, and the surface of the first pixel definition layer 111 away from the base substrate 1 is flush with a surface of a portion of the first electrode 10 located outside the groove and away from the base substrate 1.

Step 4, as shown in FIGS. 5 and 6, the organic light-emitting layer 12 is formed.

To be specific, the organic light-emitting layer may be formed on the base substrate 1 after Step 3 has been performed thereon through inkjet printing. Since the surface of the first pixel definition layer 111 away from the base substrate 1 and the surface of the portion of the first electrode 10 outside the groove and away from the base substrate 1 form a planarization surface, so as to provide the planarization surface for forming the organic light-emitting layer through printing. Thus, after the organic light-emitting layer solution has been printed in the pixel region, it is able for the organic light-emitting layer solution to sufficiently flow in the direction perpendicular to the extension direction of the first pixel defining layer 111 and spread uniformly in adjacent pixel regions, thereby to form the organic light-emitting layer thin film with a uniform film thickness, and reduce the difference in light-emitting uniformity among pixels. The organic light-emitting layer 12 may include a first color organic light-emitting layer 121, a second color organic light-emitting layer 122, and a third color organic light-emitting layer 123.

A display substrate as shown in FIGS. 5 and 6 may be obtained through the above-mentioned steps, and then an OLED display substrate may be obtained after forming a second electrode, an encapsulation layer, etc.

In the embodiments of the present disclosure, the order of the steps is not limited to the serial numbers thereof. For a person skilled in the art, any change in the order of the steps shall also fall within the scope of the present disclosure if without any creative effort.

In order to make the objects, the technical solutions and the advantages of the present disclosure more apparent, the present disclosure will be described hereinafter in a clear and complete manner in conjunction with the drawings and embodiments. Apparently, the following embodiments merely relate to a part of, rather than all of, the embodiments of the present disclosure, and based on these embodiments, a person skilled in the art may, without any creative effort, obtain the other embodiments, which also fall within the scope of the present disclosure.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above are merely specific embodiments of the present disclosure, but a protection scope of the present disclosure is not limited thereto. Any modifications or replacements that would easily occurred to a person skilled in the art, without departing from the technical scope disclosed in the disclosure, should be encompassed in the protection scope of the present disclosure. Therefore, the protection scope of the present disclosure shall be subject to the protection scope of the claims.

What is claimed is:

1. A display substrate comprising a base substrate, a thin film transistor array layer located on the base substrate, a planarization layer covering the thin film transistor array layer, and a first electrode and a pixel definition layer located on the planarization layer, the pixel definition layer defining a plurality of pixel openings, each pixel opening comprising a first edge and a second edge adjacent to each other, the pixel definition layer comprising a first pixel definition layer parallel to the first edge and a second pixel definition layer parallel to the second edge in a display region of the display substrate, wherein a surface of the first pixel definition layer away from the base substrate is located at a level lower than a surface of the second pixel definition layer away from the base substrate, a groove parallel to the first edge is arranged in a surface of the planarization layer away from the base substrate, at least a part of the first pixel definition layer is arranged in the groove, the pixel definition layer further comprises a third pixel definition layer surrounding the display region, and a surface of the third pixel definition layer away from the base substrate is located at a level not lower than the surface of the second pixel definition layer away from the base substrate;

wherein the display substrate comprises a plurality of first electrodes separate from each other, and an orthogonal projection of a gap between adjacent first electrodes onto the base substrate is within an orthogonal projection of a groove bottom of the groove onto the base substrate.

2. The display substrate according to claim 1, wherein an orthogonal projection of the first pixel definition layer onto the base substrate is within an orthogonal projection of the groove onto the base substrate.

3. The display substrate according to claim 2, wherein the first electrode comprises a first sub-electrode portion located in the groove and a second sub-electrode portion located outside the groove, and the surface of the first pixel definition layer away from the base substrate is flush with a surface of the second sub-electrode portion away from the base substrate.

4. The display substrate according to claim 3, wherein the first sub-electrode portion is coupled to an output electrode of the thin film transistor array layer through a via hole penetrating the planarization layer.

5. The display substrate according to claim 3, wherein a groove bottom of the groove is located at a same level as a surface of an output electrode of the thin film transistor array layer away from the base substrate.

6. The display substrate according to claim 1, wherein the first electrode has a thickness of 100 nm to 130 nm.

7. The display substrate according to claim 1, wherein a width of the groove in a direction perpendicular to the first edge and parallel to the base substrate ranges from 14 μm to 16 μm.

8. The display substrate according to claim 1, wherein an orthogonal projection of the second pixel definition layer onto the base substrate does not overlap an orthogonal projection of the first electrode onto the base substrate.

9. The display substrate according to claim 8, wherein a surface of the second pixel definition layer close to the base substrate is flush with a surface of the first electrode close to the base substrate.

10. The display substrate according to claim 1, wherein the first pixel definition layer is made of a lyophilic material.

11. The display substrate according to claim 1, wherein the second pixel definition layer comprises a lyophilic material layer and a lyophobic material layer at a side of the lyophilic material layer away from the base substrate.

12. A display device, comprising the display substrate according to claim 1.

13. The display device according to claim 12, wherein an orthogonal projection of the first pixel definition layer onto the base substrate is within an orthogonal projection of the groove onto the base substrate.

14. A method for forming a display substrate, comprising forming a thin film transistor array layer, a planarization layer covering the thin film transistor array layer, and a first electrode and a pixel definition layer on the planarization layer sequentially, wherein the pixel definition layer defines a plurality of pixel openings, the pixel definition layer defines a plurality of pixel openings, each pixel opening comprises a first edge and a second edge adjacent to each other, the pixel definition layer comprises a first pixel definition layer parallel to the first edge and a second pixel definition layer parallel to the second edge in a display region of the display substrate, a surface of the first pixel definition layer away from the base substrate is located at a level lower than a surface of the second pixel definition layer away from the base substrate, the pixel definition layer further comprises a third pixel definition layer surrounding the display region, and a surface of the third pixel definition layer away from the base substrate is located at a level not lower than the surface of the second pixel definition layer away from the base substrate, and the method further comprises:

forming a groove parallel to the first edge in a surface of the planarization layer away from the base substrate; and forming at least a part of the first pixel definition layer in the groove-;

wherein the forming the first electrode comprises:

forming a first electrode material layer on the planarization layer in which the groove is formed;

patterning the first electrode material layer to form a plurality of first electrodes separate from each other, wherein an orthogonal projection of a gap between adjacent first electrodes onto the base substrate is within an orthogonal projection of a groove bottom of the groove onto the base substrate.

15. The method for forming the display substrate according to claim 14, wherein the forming the first pixel definition layer comprises:

forming the first pixel definition layer in the groove through inkjet printing.

16. The method for forming the display substrate according to claim 15, wherein each first electrode comprises a first sub-electrode portion located in the groove and a second sub-electrode portion located outside the groove, and the forming the first pixel definition layer in the groove through inkjet printing comprises:

forming the first pixel definition layer having a surface flush with a surface of the second sub-electrode portion away from the base substrate.

17. The method for forming the display substrate according to claim 14, wherein the forming the first pixel definition layer comprises:

forming the first pixel definition layer by using a lyophilic material.

18. The method for forming the display substrate according to claim 14, wherein the forming the second pixel definition layer comprises:

forming a lyophilic material layer; and forming a lyophobic material layer at a side of the lyophilic material layer away from the base substrate, wherein the lyophilic material layer and the lyophobic material layer form the second pixel definition layer.

* * * * *